(12) United States Patent
Lau et al.

(10) Patent No.: US 10,593,788 B2
(45) Date of Patent: Mar. 17, 2020

(54) REVERSE-CONDUCTING INSULATED-GATE BIPOLAR TRANSISTOR STRUCTURE AND CORRESPONDING FABRICATION METHOD THEREOF

(71) Applicant: Pui Sze Lau, Clear water bay (HK)

(72) Inventors: Pui Sze Lau, Clear water bay (HK); Xianda Zhou, Clear water bay (HK); Kin on johnny Sin, Clear water bay (HK)

(73) Assignee: Pui Sze Lau, Clear Water Bay (HK)

( * ) Notice: Subject to any disclaimer, the term of this patent is extended or adjusted under 35 U.S.C. 154(b) by 91 days.

(21) Appl. No.: 15/571,188

(22) PCT Filed: Jul. 11, 2016

(86) PCT No.: PCT/CN2016/089596
§ 371 (c)(1),
(2) Date: Nov. 1, 2017

(87) PCT Pub. No.: WO2018/010056
PCT Pub. Date: Jan. 18, 2018

(65) Prior Publication Data
US 2019/0157436 A1 May 23, 2019

(51) Int. Cl.
*H01L 29/739* (2006.01)
*H01L 29/66* (2006.01)
(Continued)

(52) U.S. Cl.
CPC ...... *H01L 29/7397* (2013.01); *H01L 27/0664* (2013.01); *H01L 27/0727* (2013.01);
(Continued)

(58) Field of Classification Search
CPC ............ H01L 29/7397; H01L 27/0727; H01L 29/739; H01L 29/08; H01L 29/06;
(Continued)

(56) References Cited

FOREIGN PATENT DOCUMENTS

CN 101060133 A 10/2007
CN 103681790 A 3/2014
(Continued)

OTHER PUBLICATIONS

International Search Report and Written Opinion of PCT/CN2016/089596 dated Feb. 6, 2017.

*Primary Examiner* — Anthony Ho
(74) *Attorney, Agent, or Firm* — Hamre, Schumann, Mueller & Larson, P.C.

(57) ABSTRACT

The present invention relates to a power semiconductor device structure and a fabrication process, and provides a high-performance RC-IGBT structure that can be fabricated without a thin wafer process. To achieve this objective, the present invention provides an RC-IGBT structure, including: an emitter electrode at the front surface; a plurality of cells under the emitter electrode; an $n^-$ drift region under the cells; a collector electrode located at the back surface; a plurality of trenches located at the back surface and being filled by the collector electrode; a mechanical support semiconductor region located between the trenches; a $p^+$ collector region located at the top of each trench and connected to the collector electrode; an n buffer region located on top of each $p^+$ collector region and below the $n^-$ drift region; and an $n^+$ cathode region at the sidewall of each trench and connected to the collector electrode.

14 Claims, 6 Drawing Sheets

(51) Int. Cl.
  *H01L 27/06* (2006.01)
  *H01L 29/10* (2006.01)
  *H01L 29/08* (2006.01)
  *H01L 29/06* (2006.01)
  *H01L 27/07* (2006.01)

(52) U.S. Cl.
  CPC .............. *H01L 29/06* (2013.01); *H01L 29/08* (2013.01); *H01L 29/0834* (2013.01); *H01L 29/1095* (2013.01); *H01L 29/66348* (2013.01); *H01L 29/739* (2013.01)

(58) Field of Classification Search
  CPC ............. H01L 27/0664; H01L 29/0834; H01L 29/1095; H01L 29/66348
  See application file for complete search history.

(56) References Cited

FOREIGN PATENT DOCUMENTS

| | | |
|---|---|---|
| CN | 103854997 A | 6/2014 |
| CN | 105895682 A | 8/2016 |

REVERSE-CONDUCTING INSULATED-GATE BIPOLAR TRANSISTOR STRUCTURE AND CORRESPONDING FABRICATION METHOD THEREOF

FIELD OF THE INVENTION

The present invention generally relates to a power semiconductor device structure and a manufacturing process, and specifically, to a reverse-conducting insulated-gate bipolar transistor (RC-IGBT). The RC-IGBT includes two devices monolithically integrated on a same chip: an IGBT and a freewheeling diode (FWD).

BACKGROUND OF THE INVENTION

RC-IGBTs have been widely applied to high-voltage power electronic systems such as induction heater. A thin wafer process is usually needed to fabricate an RC-IGBT. As a result, the fabrication process is very challenging. Therefore, an objective of the present invention is to provide a high-performance RC-IGBT structure that can be fabricated without a thin wafer process.

PRIOR ART

FIG. 1 shows a cross section of an RC-IGBT device 100 in the prior art. The device 100 includes an emitter (120), a plurality of cells under the emitter (120), an $n^-$ drift region (114) under the cells, an n buffer region (115) under the $n^-$ drift region (114), a plurality of $n^+$ cathode regions (117) and $p^+$ collector regions (116) that are located under the n buffer region (115), and a collector (122) at the bottom. The cell includes: a p base region (113) on top of the $n^-$ drift region (114); an $n^+$ emitter region (111) partially surrounded by the upper surface of the p base region (113) and connected to the emitter (120); a $p^+$ diffusion region (112) connecting the p base region (113) to the emitter (120); a gate dielectric (131) covering the sidewall surface of the p base region (113) and therefore forming a channel between the $n^+$ emitter region (111) and the $n^-$ drift region (114); and a trench gate electrode (121) surrounded by the gate dielectric (131). The emitter (120) and the collector (122) of the integrated IGBT are also the anode electrode and the cathode electrode of the integrated FWD, respectively. To obtain an optimized performance of the integrated IGBT, the wafer thickness of the device 100 should be quite small to implement a field-stop design. For example, if the device 100 has a 600-V rated voltage, the wafer thickness is about 60 μm. A dedicated system needs to be used to processing this type of thin wafer, and fabrication costs are quite high. In addition, even if the dedicated system is used, it is still quite challenging to keep the wafer from cracking to achieve a high yield. SUMMARY Therefore, an objective of the present invention is to provide a high-performance RC-IGBT structure that can be fabricated without a thin wafer process.

To achieve this objective and other objectives, the present invention provides an RC-IGBT structure. The RC-IGBT structure includes: an emitter electrode at the front surface; a plurality of cells under the emitter; an $n^-$ drift region under the cell; a collector electrode located at the back surface; a plurality of trenches located at the back surface and filled by the collector electrode; a mechanical support semiconductor region located between the trenches; a $p^+$ collector region located at the top of each trench and connected to the collector electrode; an n buffer region located on top of each $p^+$ collector region and located below the $n^-$ drift region; and an $n^+$ cathode region as a part of the mechanical support semiconductor region on the sidewall of each trench and connected to the collector electrode.

SUMMARY

Therefore, an objective of the present invention is to provide a high-performance RC-IGBT structure that can be manufactured without a thin wafer process.

To achieve this objective and other objectives, the present invention provides an RC-IGBT structure. The RC-IGBT structure includes: an emitter on a front surface; a plurality of cells under the emitter; an $n^-$ drift region under the cell; a collector located on a rear surface; a plurality of trenches located on the rear surface and filled by the collector; a mechanical support semiconductor region located between the trenches; a $p^+$ collector region located at a top of each trench and connected to the collector; an n buffer region located at a top of each $p^+$ collector region and located below the $n^-$ drift region; and an $n^+$ cathode region used as a part of the mechanical support semiconductor region on a side wall of each trench and connected to the collector.

An RC-IGBT structure includes:
an emitter located at a top on a front surface,
a plurality of cell structures located under the emitter,
a first conductive type drift region located under the cell structure,
a collector located on a rear surface,
more than one trench, the trenches being located on the rear surface and filled by the collector,
a mechanical support semiconductor region located between the trenches,
a second conductive type collector region, the second conductive type collector region being located at a top of each trench and connected to the collector,
a first conductive type buffer region, the first conductive type buffer region being located at a top of each second conductive type collector region and below the first conductive type drift region, and the first conductive type buffer region separating the drift region from the collector region;
a first conductive type cathode region, the first conductive type cathode region being used as a part of the mechanical support semiconductor region on a side wall of each trench and connected to the collector.

Further, the cell structure includes:
a second conductive type base region, the second conductive type base region being located at a top of the first conductive type drift region,
a first conductive type emitter region, the first conductive type emitter region being in contact with the second conductive type base region and connected to the emitter,
a second conductive type diffusion region, the bottom of the second conductive type diffusion region being in contact with the second conductive type base region and two sides of the top of the second conductive type diffusion region being in contact with the first conductive type emitter region, and the top of the second conductive type diffusion region further being in contact with the emitter and connecting the second conductive type base region to the emitter,
a gate dielectric, the gate dielectric covering a side wall surface of the second conductive type base region and therefore forming a channel between the first conductive type emitter region and the first conductive type drift region,
a trench gate electrode, the trench gate electrode being surrounded by the gate dielectric, and an interlayer dielectric, the interlayer dielectric separating the gate electrode from the emitter (220).

Further, the cell structure includes:

a second conductive type base region, the second conductive type base region being located above the first conductive type drift region and in contact with an upper surface of the drift region, a first conductive type emitter region, the first conductive type emitter region being in contact with an upper surface of the second conductive type base region and connected to the emitter, a second conductive type diffusion region, the second conductive type diffusion region being respectively in contact with the emitter and the second conductive type base region, and connecting the base region to the emitter, a gate dielectric, the gate dielectric covering the upper surface of the second conductive type base region and therefore forming a channel between the emitter region and the first conductive type drift region, a gate electrode, the gate electrode being located at a top of the gate dielectric, and an interlayer dielectric, the interlayer dielectric separating the gate electrode and the emitter.

Further, the first conductive type drift region has a doping concentration from $1 \times 10^{12}$ cm$^{-3}$ to $1 \times 10^{15}$ cm$^{-3}$ and a length between 30 μm and 400 μm.

Further, the trenches have a circular top view.

Further, the trenches have a hexagonal top view.

Further, a doping concentration of the first conductive type buffer region is greater than a doping concentration of the first conductive type drift region, and a length of the first conductive type buffer region is less than the length of the first conductive type drift region.

Further, the second conductive type collector region has a doping concentration from $1 \times 10^{18}$ cm$^{-3}$ to $1 \times 10^{21}$ cm$^{-3}$ and a depth between 0.1 μm and 1 μm.

Further, the first conductive type cathode region (217/317) has a doping concentration from $1 \times 10^{19}$ cm$^{-3}$ to $1 \times 10^{21}$ cm$^{-3}$.

A method for manufacturing an RC-IGBT structure includes the following steps:

starting from a substrate wafer, forming a plurality of cell structures on a front surface of the wafer, forming more than one trench on a rear surface of the wafer by using a hard mask and at the same time forming a first conductive type drift region, forming a first conductive type buffer region at a top of each trench and forming a first conductive type cathode region on a side wall of each trench, forming a second conductive type collector region under the first conductive type buffer region, removing the hard mask, forming a collector on the rear surface of the wafer, and forming an emitter on the front surface of the wafer.

Further, the first conductive type buffer region and the first conductive type cathode region are formed at the same time by means of diffusion.

Further, the first conductive type buffer region is formed by means of diffusion, and next the first conductive type cathode region is formed by using angled ion implantation and annealing.

Further, the first conductive type cathode region is formed by means of diffusion, and next the first conductive type buffer region is formed by using silicon anisotropic etching and subsequent diffusion.

Further, the collector is formed by depositing a metal layer.

Further, the collector is formed by depositing a metal layer and subsequently performing planarization.

A beneficial effect is that a high-performance RC-IGBT structure is manufactured without needing a thin wafer process.

DETAILED DESCRIPTION

In the present invention, an n channel device is used to perform description. However, it should be understood that in the following descriptions that the present invention is similarly applicable to a p channel device. In the specification of the present invention, a heavily doped n⁻ type region is marked as n⁺, and a heavily doped p-type region is marked as p⁺. Unless otherwise indicated, in silicon, a heavily doped region usually has a doping concentration between $1 \times 10^{19}$ cm$^{-3}$ and $1 \times 10^{21}$ cm$^{-3}$. In the specification of the present invention, a lightly doped n⁻ type region is marked as n⁻, and a lightly doped p-type region is marked as p⁻. Unless otherwise indicated, in silicon, a lightly doped region usually has a doping concentration between $1 \times 10^{13}$ cm$^{-3}$ and $1 \times 10^{17}$ cm$^{-3}$.

Figures 1, 2:
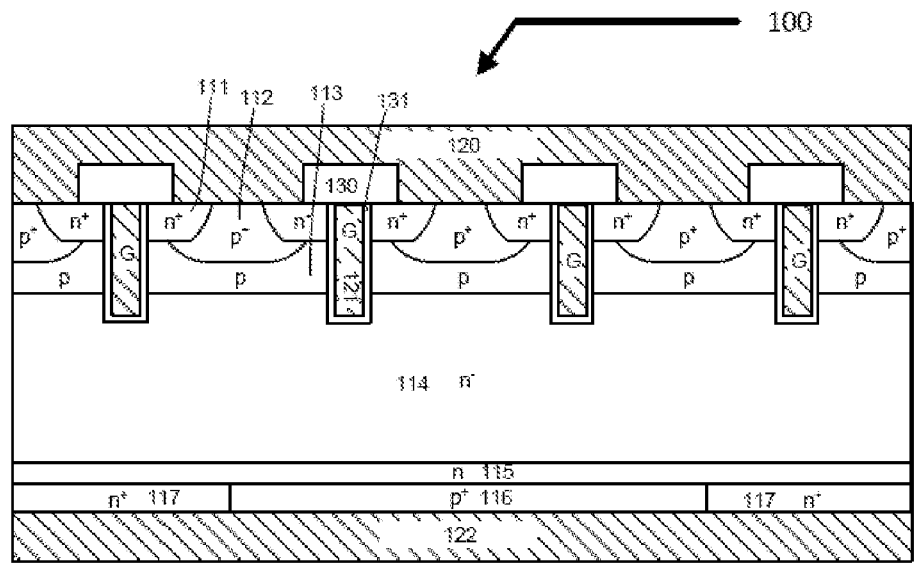
FIG. 1 is a cross-sectional view of an RC-IGBT device 100 in the prior art.
FIG. 2 is a cross-sectional view of the present invention implemented in a trench gate RC-IGBT device 200.

FIG. 2 is a cross-sectional view of the present invention implemented in a trench gate RC-IGBT device 200. The device 200 includes: an emitter electrode (220) at the front surface; a plurality of cell structures located under the emitter electrode (220); an n⁻ drift region (214) under the cell structures; a collector electrode (222) located at the back surface; a plurality of trenches (240) located at the back surface and being filled by the collector electrode (222); a mechanical support semiconductor region (241) located between the trenches (240); a p⁺ collector region (216) located at the top of each trench (240) and connected to the collector electrode (222); an n buffer region (215) located on top of each p⁺ collector region (216) and below the n⁻ drift region (214); and an n⁺ cathode region (217) as a part of the mechanical support semiconductor region (241) on the sidewall of each trench (240) and connected to the collector electrode (222). Compared with the device 100, the device 200 has the same cell structures, where the cell structure includes: a p base region (213) located on top of the n⁻ drift region (214); an n⁺ emitter region (211) partially surrounded by the upper surface of the p base region (213) and connected to the emitter electrode (220); a p⁺ diffusion region (212) connecting the p base region (213) to the emitter electrode (220); a gate dielectric (231) covering the sidewall surface of the p base region (213) and therefore forming a channel between the n⁺ emitter region (211) and the n⁻ drift region (214); a trench gate electrode (221) surrounded by the gate dielectric (231); and an interlayer dielectric (230)

separating the gate electrode (221) from the emitter electrode (220). When the device 200 is at on-state, the sidewall surface of the p base region (213) is inverted and an n⁻ type channel is formed between the n⁺ emitter region (211) and the n⁻ drift region (214), so that electrons can flow through the channel. If the current density is relatively low (for example, much lower than 100 A/cm$^2$) at the on-state, the device operates as a power MOSFET, and the n⁺ cathode region (217) is the drain of the power MOSFET. If current density is relatively high (for example, about 100 A/cm$^2$) at the on-state, the junction of the p⁺ collector region (216) and the n buffer region (215) is forward biased, and the device operates as an IGBT. When the device 200 is at off-state, the current is blocked by the reversely biased junction of the n⁻ drift region (214) and the p base region (213). When the device 200 is reversely conducting current, the FWD composed of the p base region (213), the n⁻ drift region (214) and the n⁺ cathode region (217) is forward biased, and the reverse current will flow from the emitter electrode (220) to the collector electrode (222). The operation mechanism of the device 200 is approximately the same as the operation mechanism of the device 100. However, the back surface of the device 200 has a three-dimensional structure, but the back surface of device 100 does not. As shown in FIG. 2, in the device 200, a plurality of deep trenches (240) exists at the back surface. At each trench, the p⁺ collector region (216) of the integrated IGBT is located at the top side, and the n⁺ cathode region (217) of the integrated FWD is located at the sidewall. The structure enables the integrated IGBT to have a relatively thin device thickness (for example, 60 μm), and at the same time the semiconductor region (241) between the trenches is kept relatively thick (for example, about 700 μm) for mechanical support. The relatively small device thickness of the integrated IGBT is desirable, since a state-of-the-art field-stop back surface structure can be implemented, and at the same time the mechanical support semiconductor region (241) ensures that the device wafer can be normally processed without paying special attention. In addition, because the n⁺ cathode region (217) of the integrated FWD is a part of the support semiconductor region (241), the mechanical support semiconductor region (241) does not cause any waste in terms of the electrical performance.

Based on the operation mechanism of the device 200, structural parameters need to be correspondingly designed. In a blocking state of the device 200, the blocking voltage is mainly sustained by the lightly doped n⁻ drift region (214). The doping concentration and length of the n⁻ drift region (214) depend on the rated voltage of the device, and usually an IGBT has a rated voltage between 400 V and 6000 V. Based on this range, the doping concentration of the n⁻ drift region (214) is between $1\times10^{12}$ cm$^{-3}$ and $1\times10^{15}$ cm$^{-3}$, and the length of the n⁻ drift region (214) is between 30 μm and 400 μm. Since the blocking voltage is mainly sustained by the depleted n⁻ drift region (214), the length of the n buffer region (215) can be much less than the length of the n⁻ drift region (214). In another aspect, the doping concentration of the n buffer region (215) should be greater than the doping concentration of the n⁻ drift region (214), because the n buffer region (215) should stop the extension of the depletion region at blocking state. In the on-state of the device, if the current density is relatively low (for example, much lower than 100 A/cm$^2$), the device operates as a power MOSFET, and the n⁺ cathode region (217) is the drain of the power MOSFET. To form a desirable ohmic contact with the collector electrode (222), the n⁺ cathode region (217) needs to be heavily doped. If the current density at the on-state is relatively high (for example, about 100 A/cm$^2$), the junction of the p⁺ collector region (216) and the n buffer region (215) is forward biased, and the device operates as an IGBT. In the IGBT mode, holes are injected into the n⁻ drift region (214) from the p⁺ collector region (216), so as to obtain a on-state loss relatively lower than the on-state loss in the power MOSFET mode. However, hole injection efficiency at the junction of the p⁺ collector region (216) and the n buffer region (215) at the back surface should not be too high to cause a significant decrease in switching speed. Therefore, for the p⁺ collector region (216), preferably, the doping concentration is from $1\times10^{18}$ cm$^{-3}$ to $1\times10^{21}$ cm$^{-3}$ and the depth is between 0.1 μm and 1 μm.

Figure 3:
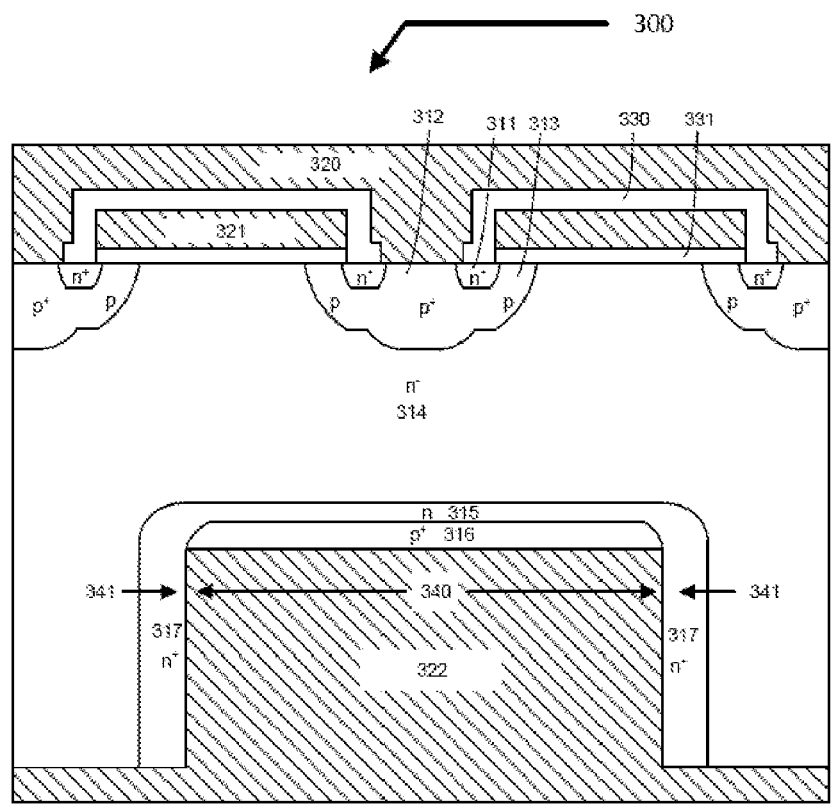
FIG. 3 is a cross-sectional view of the present invention implemented in a planar-gate RC-IGBT device 300.

FIG. 3 is a cross-sectional view of the present invention implemented in a planar-gate RC-IGBT device 300. The back surface structure of the device 300 is the same as the back surface structure of the device 200, and similarly includes: an emitter electrode (320) at the front surface; a plurality of cell structures located under the emitter electrode (320); an n⁻ drift region (314) located under the cell structure; a collector electrode (322) located at the back surface; a plurality of trenches (340) located at the back surface and being filled by the collector electrode (322); a mechanical support semiconductor region (341) located between the trenches (340); a p⁺ collector region (316) located at the top of each trench (340) and connected to the collector electrode (322); an n buffer region (315) located on top of each p⁺ collector region (316) and below the n⁻ drift region (314); and an n⁺ cathode region (317) as a part of the mechanical support semiconductor region (341) at the sidewall of each trench (340) and connected to the collector electrode (322). Operation mechanisms of the device 300 and the device 200 are also the same. The only difference between the device 300 and the device 200 is the cell structure. In the device 300, the cell includes: a p base region (313) partially surrounded by the upper surface of the n⁻ drift region (314); an n⁺ emitter region (311) partially surrounded by the upper surface of the p base region (313) and connected to the emitter electrode (320); a p⁺ diffusion region (312) connecting the p base region (313) to the emitter electrode (320); a gate dielectric (331) covering the upper surface of the p base region (313) and therefore forming a channel between the n⁺ emitter region (311) and the n⁻ drift region (314); a gate electrode (321) located on top of the gate dielectric (331); and an interlayer dielectric (330) separating the gate electrode (321) from the emitter electrode (320).

Figure 4:
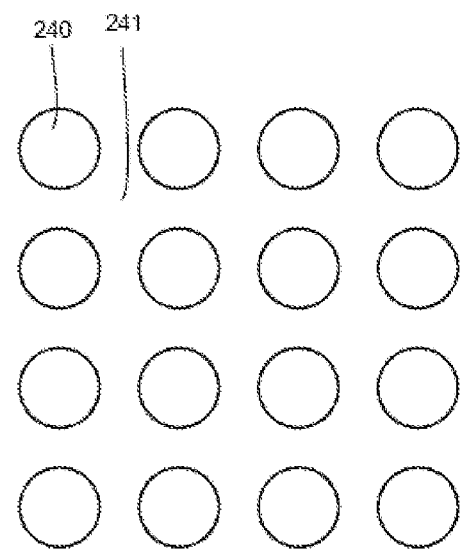
FIG. 4 shows a backside surface pattern design used for the foregoing device 200 shown in FIG. 2.

FIG. 4 shows a back surface pattern design used for the foregoing device 200 shown in FIG. 2. As shown in FIG. 4, the trenches (240) have a circular top view. In the circular pattern, no sharp corner is formed at the sidewall, and therefore the uniformity of the trenches (240) in the fabrication process can be improved. The same design is also applicable to the device 300.

Figure 5:
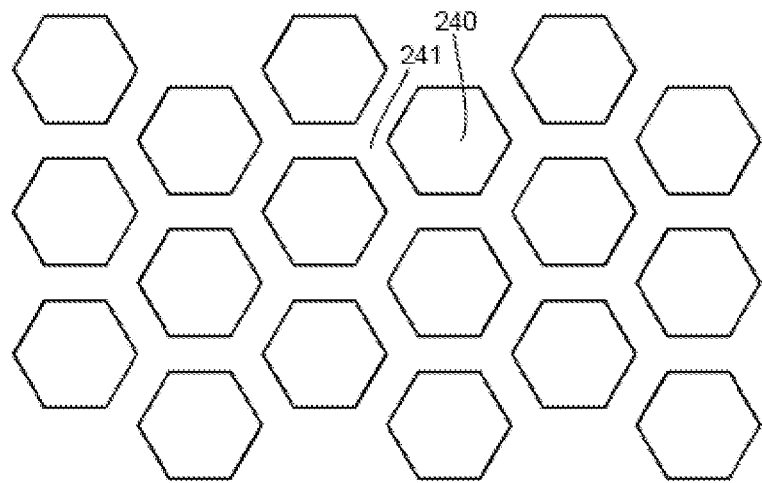
FIG. 5 shows another backside surface pattern design used for the foregoing device 200 shown in FIG. 2.

FIG. 5 shows another back surface pattern design used for the foregoing device 200 shown in FIG. 2. As shown in FIG. 5, the trenches (240) have a hexagonal top view. In the hexagonal pattern, the trenches (240) can be tightly arranged, and therefore the percentage of the area occupied by the integrated IGBT is maximized without changing the design rule. The same design is also applicable to the device 300.

FIG. 6 to FIG. 12 show a method for fabricating the foregoing device 200 shown in FIG. 2. The fabrication method includes: 1) starting with a lightly doped n⁻ type substrate wafer; 2) forming a plurality of cells at the front surface of wafer; 3) forming a plurality of trenches (240) on at the back surface of the wafer by using a hard mask (232) and at the same time forming the n⁻ drift region (214); 4) forming the n buffer region (215) at the top of each trench and forming the n⁺ cathode region (217) at the sidewall of each trench; 5) forming the collector region (216) under the buffer region (215); 6) removing the hard mask (232); 7) forming the collector electrode (222) at the back surface of the wafer; 8) forming the emitter electrode (220) at the front surface of the wafer.

Figure 6:
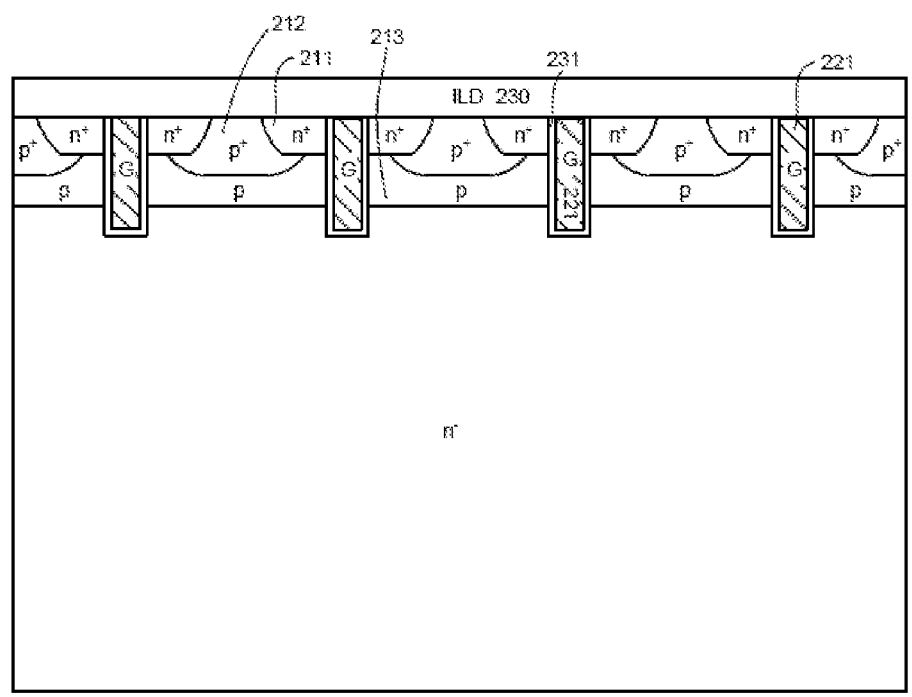
FIG. 6 to FIG. 12 show a method for fabricating the foregoing device 200 shown in FIG. 2.

FIG. 6 shows a cell formed at the front surface of the wafer. The wafer to start is a lightly doped n⁻ type substrate wafer. The doping concentration of the substrate wafer should be the same as a targeted doping concentration of the n⁻ drift region (214). The substrate wafer has a normal thickness. For example, a normal 6-inch wafer has a thickness of about 700 μm. The cell is formed by using a common trench gate technology known to person skilled in the art. To avoid polluting a furnace tube in the following step, in this step, the emitter electrode (220) is not formed and the interlayer dielectric (230) is not patterned.

Figure 7:
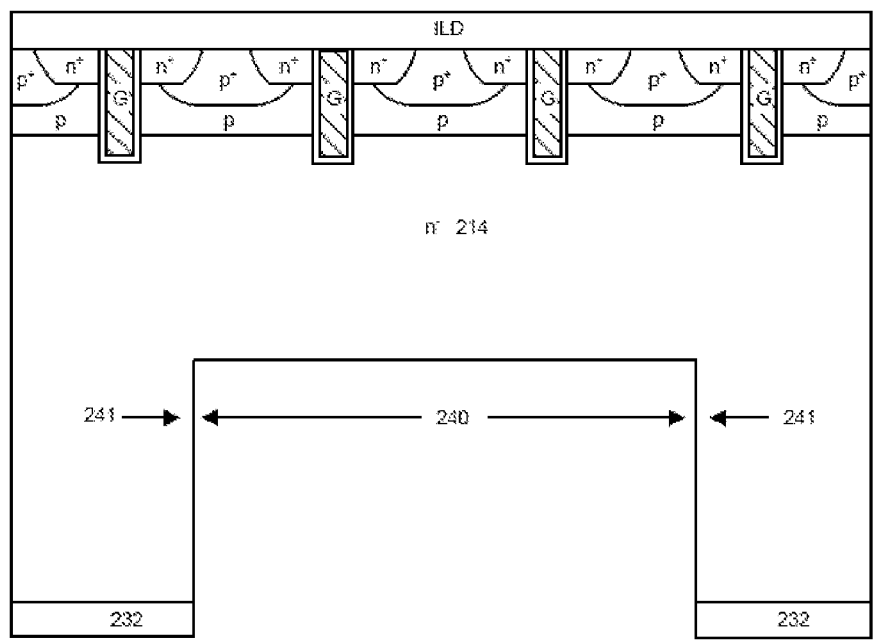

FIG. 7 shows that the trench (240) is formed at the back surface and the n⁻ drift region (214) is also formed. First, a hard mask layer (232) is deposited at the back surface and is patterned. Next, the trench (240) is etched by using the hard mask (232), and at the same time, the remaining part of the wafer is the n⁻ drift region (214). The hard mask (232) is typically, but not limited to, silicon oxide, and etching is typically, but not limited to, deep reactive ion-etching (DRIE). The depth of the trench (240) depends on the required length of the n⁻ drift region (214) and the thickness of the wafer. For example, a normal 6-inch wafer has a thickness of about 700 μm, and a 600-V field-stop IGBT requires that the length of the n⁻ drift region (214) is about 60 μm. In this case, the depth of the trench (240) should be 640 μm, that is, the difference between the wafer thickness and the length of the target n⁻ drift region (214). In another aspect, the width of the trench depends on a specific design, and the width is typically between 50 μm and 500 μm.

Figure 8:
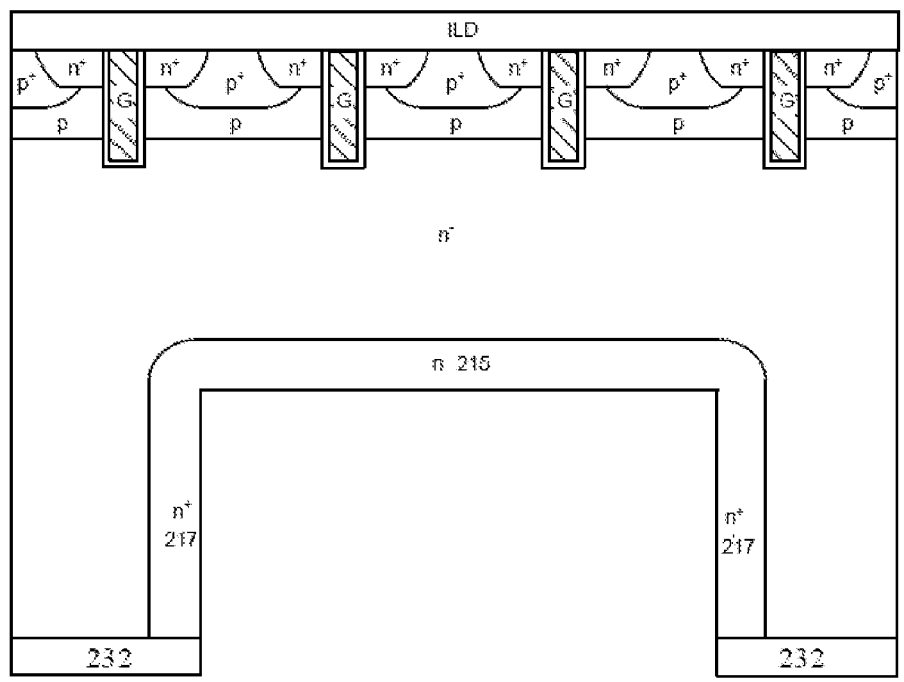

FIG. 8 shows that the n buffer region (215) and the n⁺ cathode region (217) are formed. In an embodiment of the present invention, the n buffer region (215) and the n⁺ cathode region (217) are formed at the same time by means of diffusion. For example, phosphorous can be diffused into silicon at about 1000 Celsius degree to form a heavily doped n region at the surface of the trench (240). In this case, the fabrication process is simple. However, this may result in a high doping concentration in the n buffer region (215), which adversely affects implementation of the field-stop design. In another embodiment of the present invention, the n buffer region (215) is formed by means of diffusion, and then the n⁺ cathode region (217) is formed by using angled ion implantation and annealing. In this case, the doping concentration of the n buffer region (215) will be independent to the doping concentration of the n⁺ cathode region (217), and is determined according to required device performance. In addition, by controlling the implantation angle, the n⁺ cathode region (217) may be kept separated from the top of the trench. In this way, a relatively large resistance is obtained between the n⁺ cathode region (217) and the junction of the p⁺ collector region (216) and the n buffer region (215). A relatively large resistance facilitates the turn-on of the IGBT at a relatively low current density, so as to inhibit the snap-back effect in the RC-IGBT. In still another embodiment of the present invention, first, the n⁺ cathode region (217) is formed by means of diffusion. Then, the n⁺ silicon region at the top of the trench (240) is etched away by using anisotropic etching. The anisotropic etching is typically but not limited to DRIE. Subsequently, a relatively small dosage is used to perform diffusion to form the n buffer region (215). In this case, the doping concentration of the n buffer region (215) can also be independent to the doping concentration of the n⁺ cathode region (217). In addition, by controlling the silicon over etching, the n⁺ cathode region (217) may also be kept separated from the top of the trench (240), and therefore the snap-back effect of the device may be inhibited. Finally, it should be noted that, in all these embodiments, no fixed boundary exists between the n buffer region (215) and the n⁺ cathode region (217), since the two regions are close to each other and have the same doping type.

Figure 9:
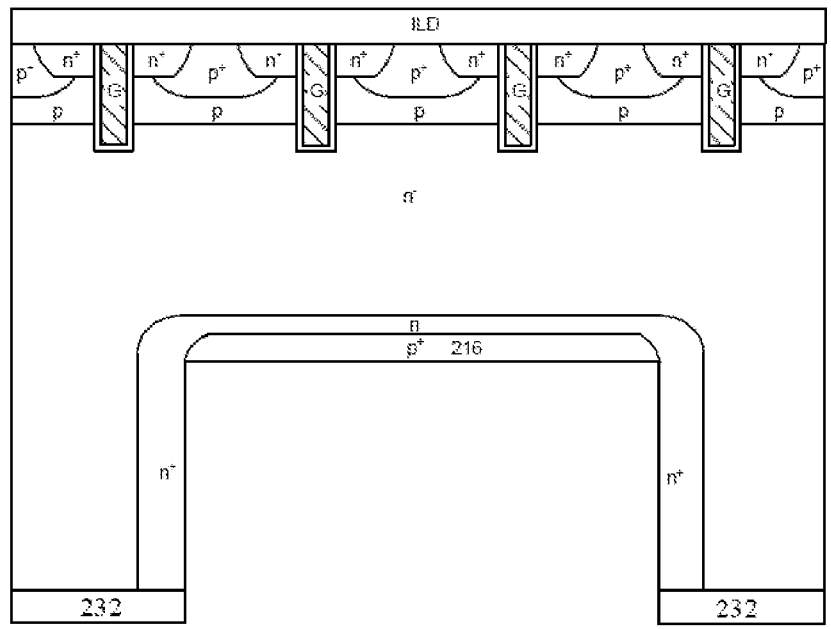

FIG. 9 shows that the p⁺ collector region (216) is formed. The p⁺ collector region (216) is formed through ion implantation and annealing. It should be noted that, when the p⁺ collector region (216) is formed, the n buffer region (215) is partially consumed. However, the n⁺ cathode region (217) is not consumed, since the n⁺ cathode region (217) is located at the sidewall of the trench (240).

Figure 10:
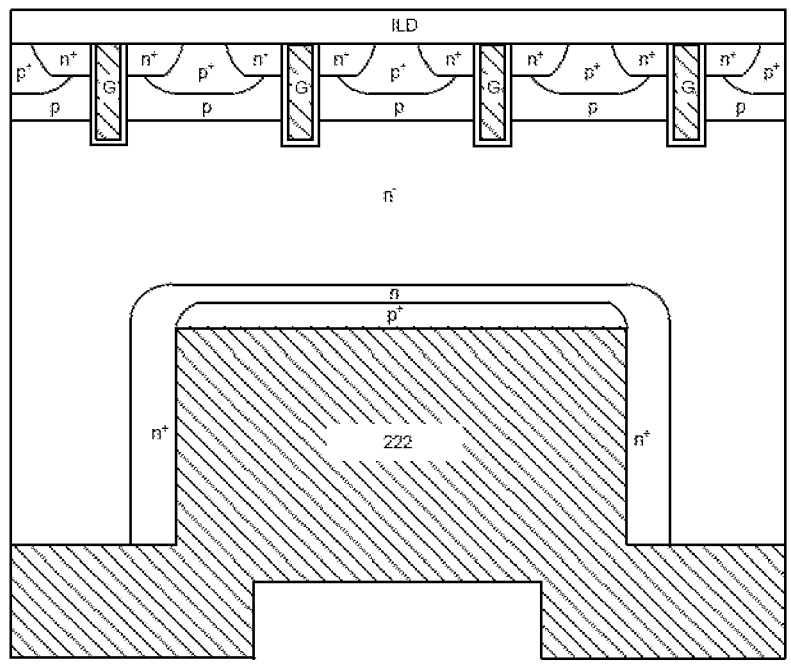

FIG. 10 shows that the collector electrode (222) is formed on the back surface of the wafer. First, the hard mask (232) is removed. Next, a metal layer is deposited on the back surface of the wafer to form the collector electrode (222). The hard mask (232) usually can be removed by using wet etching. The metal layer can be deposited through sputtering, evaporation or electroplating.

Figure 11:
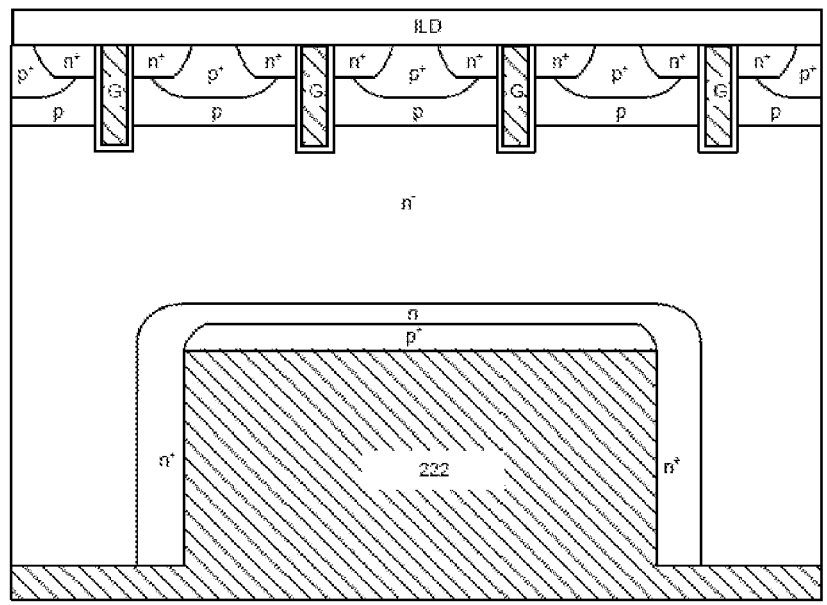

FIG. 11 shows an optional planarization step for the collector electrode (222). Planarization may be optionally performed after the deposition of metal. The planarization is mechanical grinding or chemical mechanical polishing or chemical mechanical polishing after mechanical grinding. A smooth back surface facilitates packaging, because the smooth rear surface can reduce the gap at the back surface of a chip in the packaging process.

Figure 12:
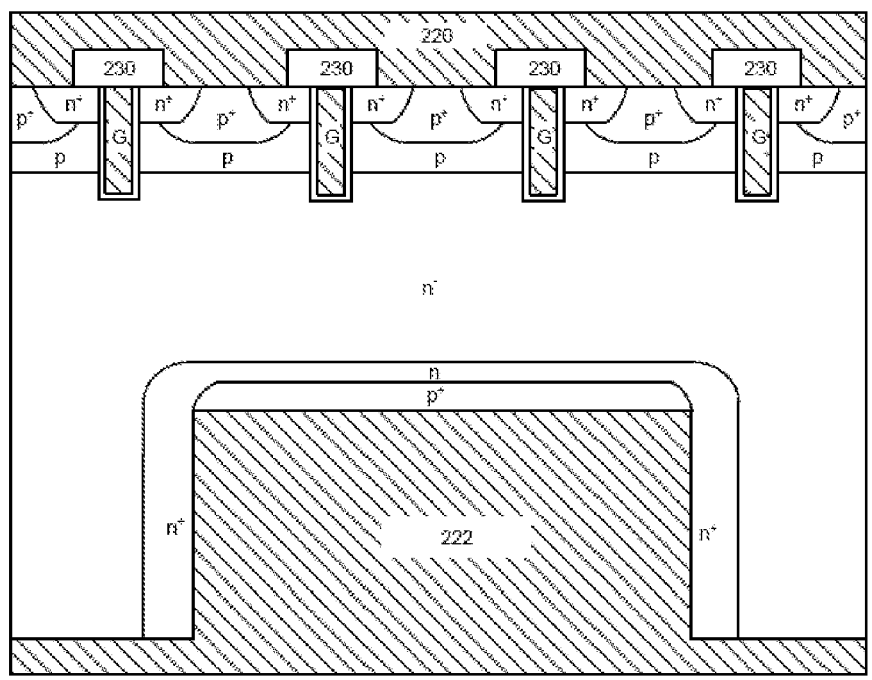

FIG. 12 shows that the emitter electrode (220) is formed at the front surface of the wafer. First, the interlayer dielectric (230) is patterned. Next, a metal layer is deposited at the front surface to form the emitter electrode (220). Subsequently, alloy annealing can be performed to reduce contact resistance of the emitter electrode (220).

Finally, it should be noted that, the fabrication method is independent to the cell structure of the device, since the cells are formed before the back surface is processed. Therefore, although the device 200 is used as an example to describe the fabrication method, the same method is also applicable to the device 300.

What is claimed is:

1. A reverse-conducting insulated-gate bipolar transistor structure, comprising:
   an emitter electrode located at the front surface,
   a plurality of cell structures located under the emitter electrode,
   a first conductive type drift region located under the cell structures,
   a collector electrode located at the back surface,
   more than one trench, the trenches being located at the back surface and filled by the collector electrode,
   a mechanical support semiconductor region located between the trenches,
   a second conductive type collector region, the second conductive type collector region being located at the top of each trench and connected to the collector electrode,
   a first conductive type buffer region, the first conductive type buffer region being located on top of each second conductive type collector region and below the first conductive type drift region, and the first conductive type buffer region separating the drift region from the collector region; and a first conductive type cathode region, the first conductive type cathode region being a part of the mechanical support semiconductor region at the sidewall of each trench and connected to the collector electrode, wherein the trenches have a circular top view.

2. The RC-IGBT structure according to claim 1, wherein the cell structure comprises:

a second conductive type base region, the second conductive type base region being located on top of the first conductive type drift region, a first conductive type emitter region, the first conductive type emitter region being in contact with the second conductive type base region and connected to the emitter, a second conductive type diffusion region, the bottom of the second conductive type diffusion region being in contact with the second conductive type base region and two sides of the top of the second conductive type diffusion region being in contact with the first conductive type emitter region, and the top of the second conductive type diffusion region further being in contact with the emitter electrode and connecting the second conductive type base region to the emitter electrode, a gate dielectric, the gate dielectric covering the sidewall surface of the second conductive type base region and therefore forming a channel between the first conductive type emitter region and the first conductive type drift region, a trench gate electrode, the trench gate electrode being surrounded by the gate dielectric, and an interlayer dielectric, the interlayer dielectric separating the gate electrode from the emitter electrode.

3. The RC-IGBT structure according to claim 1, wherein the cell structure comprises:

a second conductive type base region, the second conductive type base region being located above the first conductive type drift region and in contact with the upper surface of the drift region, a first conductive type emitter region, the first conductive type emitter region being in contact with the upper surface of the second conductive type base region and connected to the emitter electrode, a second conductive type diffusion region, the second conductive type diffusion region being respectively in contact with the emitter electrode and the second conductive type base region and connecting the base region to the emitter electrode, a gate dielectric, the gate dielectric covering the upper surface of the second conductive type base region and therefore forming a channel between the emitter region and the first conductive type drift region, a gate electrode, the gate electrode being located on top of the gate dielectric, and an interlayer dielectric, the interlayer dielectric separating the gate electrode from the emitter electrode.

4. The RC-IGBT structure according to claim 1, wherein the first conductive type drift region has a doping concentration from $1 \times 10^{12}$ cm$^{-3}$ to $1 \times 10^{15}$ cm$^{-3}$ and a length between 30 μm and 400 μm.

5. The RC-IGBT structure according to claim 1, wherein the doping concentration of the first conductive type buffer region is greater than the doping concentration of the first conductive type drift region, and the length of the first conductive type buffer region is less than the length of the first conductive type drift region.

6. The RC-IGBT structure according to claim 1, wherein the second conductive type collector region has a doping concentration from $1 \times 10^{18}$ cm$^{-3}$ to $1 \times 10^{21}$ cm$^{-3}$ and a depth between 0.1 μm and 1 μm.

7. The RC-IGBT structure according to claim 1, wherein the first conductive type cathode region has a doping concentration from $1 \times 10^{19}$ cm$^{-3}$ to $1 \times 10^{21}$ cm$^{-3}$.

8. A method for fabricating the RC-IGBT structure of claim 1, comprising:

starting with a substrate wafer, forming the plurality of cell structures at the front surface of the wafer, forming the more than one trench at the back surface of the wafer by using a hard mask and at the same time forming the first conductive type drift region, forming the first conductive type buffer region at the top of each trench and forming the first conductive type cathode region at the sidewall of each trench, forming the second conductive type collector region under the first conductive type buffer region, removing the hard mask, forming the collector electrode at the back surface of the wafer, and forming the emitter electrode at the front surface of the wafer.

9. The fabrication method according to claim 8, wherein the first conductive type buffer region and the first conductive type cathode region are formed at the same time by means of diffusion.

10. The fabrication method according to claim 8, wherein the first conductive type buffer region is formed by means of diffusion, and next the first conductive type cathode region is formed by using angled ion implantation and annealing.

11. The fabrication method according to claim 8, wherein the first conductive type cathode region is formed by means of diffusion, and next the first conductive type buffer region is formed by using silicon anisotropic etching and subsequent diffusion.

12. The fabrication method according to claim 8, wherein the collector electrode is formed by depositing a metal layer.

13. The fabrication method according to claim 8, wherein the collector electrode is formed by depositing a metal layer and subsequently performing planarization.

14. A reverse-conducting insulated-gate bipolar transistor structure, comprising:

an emitter electrode located at the front surface, a plurality of cell structures located under the emitter electrode, a first conductive type drift region located under the cell structures, a collector electrode located at the back surface, more than one trench, the trenches being located at the back surface and filled by the collector electrode, a mechanical support semiconductor region located between the trenches, a second conductive type collector region, the second conductive type collector region being located at the top of each trench and connected to the collector electrode, a first conductive type buffer region, the first conductive type buffer region being located on top of each second conductive type collector region and below the first conductive type drift region, and the first conductive type buffer region separating the drift region from the collector region; and a first conductive type cathode region, the first conductive type cathode region being a part of the mechanical support semiconductor region at the sidewall of each trench and connected to the collector electrode, wherein the trenches have a hexagonal top view.

* * * * *